United States Patent [19]

Arao et al.

[11] Patent Number: 4,617,246

[45] Date of Patent: Oct. 14, 1986

[54] PHOTOCONDUCTIVE MEMBER OF A GE-SI LAYER AND SI LAYER

[75] Inventors: Kozo Arao, Yokohama; Keishi Saitoh, Tokyo, both of Japan

[73] Assignee: Canon Kabushiki Kaisha, Tokyo, Japan

[21] Appl. No.: 547,241

[22] Filed: Oct. 31, 1983

[30] Foreign Application Priority Data

| | | | |
|---|---|---|---|
| Nov. 4, 1982 | [JP] | Japan | 57-194360 |
| Nov. 5, 1982 | [JP] | Japan | 57-194354 |
| Nov. 6, 1982 | [JP] | Japan | 57-195059 |
| Nov. 8, 1982 | [JP] | Japan | 57-196398 |

[51] Int. Cl.[4] .......... G03G 5/082

[52] U.S. Cl. .......... 430/65; 430/66; 430/84; 430/95

[58] Field of Search .......... 430/65, 66, 84, 95; 29/372

[56] References Cited

U.S. PATENT DOCUMENTS

| | | | |
|---|---|---|---|
| 4,402,762 | 9/1983 | John et al. | 29/572 |
| 4,414,319 | 11/1983 | Shirai et al. | 430/84 |
| 4,460,670 | 7/1984 | Ogawa et al. | 430/84 |
| 4,490,450 | 12/1984 | Shimizu et al. | 430/95 |
| 4,491,626 | 1/1985 | Kawamura et al. | 430/95 |

*Primary Examiner*—John L. Goodrow

*Attorney, Agent, or Firm*—Fitzpatrick, Cella, Harper & Scinto

[57] ABSTRACT

A photoconductive member, which comprises a support for photoconductive member and a light receiving layer having a layer constitution comprising a first layer region comprising an amorphous material containing $Ge_xSi_{1-x}$ ($0.95<x\leqq 1$) and a second layer region comprising silicon atoms exhibiting photoconductivity, two layer regions being provided successively from the support side.

40 Claims, 11 Drawing Figures

PHOTOCONDUCTIVE MEMBER OF A GE-SI LAYER AND SI LAYER

BACKGROUND OF THE INVENTION

1. Field of the Invention

This invention relates to a photoconductive member having sensitivity to electromagnetic waves such as light [herein used in a broad sense, including ultraviolet rays, visible light, infrared rays, X-rays, gamma rays and the like].

2. Description of the Prior Arts

Photoconductive materials, which constitute image forming members for electrophotography in solid state image pick-up devices or in the field of image formation, or photoconductive layers in manuscript reading devices, are required to have a high sensitivity, a high SN ratio [Photocurrent ($I_p$)/Dark current ($I_d$)], spectral characteristics matching to those of electromagnetic waves to be irradiated, a rapid response to light, a desired dark resistance value as well as no harm to human bodies during usage. Further, in a solid state image pick-up device, it is also required that the residual image should easily be treated within a predetermined time. In particular, in case of an image forming member for electrophotography to be assembled in an electrophotographic device to be used in an office as office apparatus, the aforesaid harmless characteristic is very important.

From the standpoint as mentioned above, amorphous silicon [hereinafter referred to as a-Si] has recently attracted attention as a photoconductive material. For example, German Laid-Open Patent Publication Nos. 2746967 and 2855718 disclose applications of a-Si for use in image forming members for electrophotography, and German Laid-Open Patent Publication No. 2933411 an application of a-Si for use in a photoconverting reading device.

However, under the present situation, the photoconductive members having photoconductive layers constituted of a-Si are further required to be improved in a balance of overall characteristics including electrical, optical and photoconductive characteristics such as dark resistance value, photosensitivity and response to light, etc., and environmental characteristics during use such as humidity resistance, and further stability with lapse of time.

For instance, when applied in an image forming member for electrophotography, residual potential is frequently observed to remain during use thereof if improvements to higher photosensitivity and higher dark resistance are scheduled to be effected at the same time. When such a photoconductive member is repeatedly used for a long time, there will be caused various inconveniences such as accumulation of fatigues by repeated uses or so called ghost phenomenon wherein residual images are formed, or when it is used at a high speed repeatedly, response is gradually lowered.

Further, a-Si has a relatively smaller absorption coefficient in the wavelength region longer than the longer wavelength region side in the visible light region as compared with that on the shorter wavelength region side, and therefore in matching to the semiconductor laser practically used at the present time or when using a presently available halogen lamp or fluorescent lamp as the light source, there remains room for improvement in that the light on the longer wavelength side cannot effectively be used.

Besides, when the light irradiated cannot sufficiently be absorbed into the photoconductive layer but the dosage of the light reaching the support is increased, if the support itself has a high reflectance of the light permeating through the photoconductive member, there will occur interference due to multiple reflections which may be a cause for formation of "unfocused image".

This effect becomes greater, if the spot irradiated is made smaller in order to enhance resolution, and it is a great problem particularly when using a semiconductor laser as light source.

On the other hand, in view of matching with semiconductor laser, it has also been proposed to provide a light receiving layer constituted of an amorphous material containing at least germanium atoms. However, in this case, problems are sometimes involved in adhesion between the support and the light receiving layer and diffusion of impurities from the support to the light receiving layer.

Thus, it is required in designing of a photoconductive material to make efforts to overcome all of the problems as mentioned above along with the improvement of a-Si materials per se.

In view of the above points, the present invention contemplates the achievement obtained as a result of extensive studies made comprehensively from the standpoints of applicability and utility of a-Si as a photoconductive member for image forming members for electrophotography, solid state image pick-up devices, reading devices, etc. It has now been found that a photoconductive member having a layer constitution of photoconductive layer comprising a light receiving layer exhibiting photoconductivity, which is constituted of so called hydrogenated amorphous silicon, halogenated amorphous silicon or halogen-containing hydrogenated amorphous silicon which is an amorphous material containing at least one of hydrogen atom (H) and halogen atom (X) in a matrix of a-Si, especially silicon atoms [hereinafter referred to comprehensively as a-Si(H,X)], said photoconductive member being prepared by designing so as to have a specific structure as hereinafter described, is found to exhibit not only practically extremely excellent characteristics but also surpass the photoconductive members of the prior art in substantially all respects, especially having markedly excellent characteristics as a photoconductive member for electrophotography as well as excellent absorption characteristics on the longer wavelength side. The present invention is based on such finding.

SUMMARY OF THE INVENTION

An object of the present invention is to provide a photoconductive member which is high in photosensitivity in all visible light regions, particularly excellent in matching with semiconductor laser and rapid in light response.

Another object of the present invention is to provide a photoconductive member having excellent electrophotographic characteristics, which is sufficiently capable of retaining charges at the time of charging treatment for formation of electrostatic charges to the extent such that a conventional electrophotographic method can be very effectively applied when it is provided for use as an image forming member for electrophotography.

Still another object of the present invention is to provide a photoconductive member for electrophotography capable of providing easily a high quality image which is high in density, clear in halftone and high in resolution.

Further, another object of the present invention is to provide a photoconductive member having high photosensitivity and high SN ratio characteristic.

Further object of the present invention is to provide a photoconductive member having electrical, optical and photoconductive characteristics which are constantly stable and all-environment type with virtually no dependence on the environments under use, which member is markedly excellent in light fatigue resistance without causing deterioration phenomenon when used repeatedly, exhibiting no or substantially no residual potential observed.

According to the present invention, there is provided a photoconductive member which comprises a support for photoconductive member and a light receiving layer having a layer constitution of a first layer region comprising an amorphous material containing $Ge_xSi_{1-x}(0.95<X\leqq 1)$ [hereinafter written as a-$Ge_xSi_{1-x}$(H,X)] and a second layer region comprising silicon atoms exhibiting photoconductivity, two layer regions being provided successively from the support side.

PREFERRED EMBODIMENT OF THE INVENTION

Figure 1:
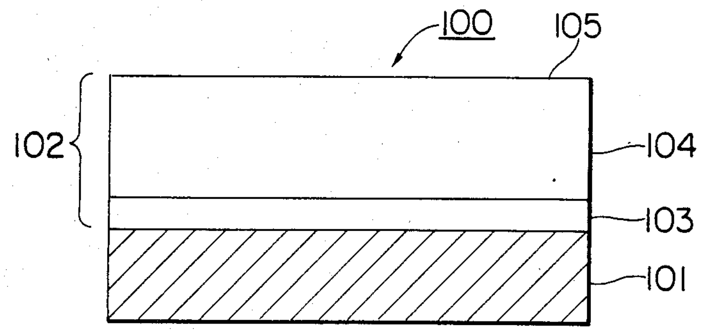
FIG. 1 shows a schematic sectional view for illustration of the layer constitution of a preferred embodiment of the photoconductive member according to the present invention.

Referring now to the drawings, the photoconductive members according to the present invention are to be described in detail below.

FIG. 1 shows a schematic sectional view for illustration of the layer constitution of a first embodiment of the photoconductive member of this invention.

The photoconductive member 100 shown in FIG. 1 has a light receiving layer 102 on a support 101 for photoconductive member, said light receiving layer 102 having a free surface 105 on one of the end surfaces.

The light receiving layer 102 has a layer constitution comprising a first layer region (G) 103 constituted of a-$Ge_xSi_{1-x}$(H, X) and a second layer region (S) 104 constituted of a-Si(H,X) and having photoconductivity, succesively laminated from the side of the support 101. The germanium atoms contained in the first layer region (G) 103 are distributed in said layer region (G) 103 in a distribution continuous and uniform in the direction substantially perpendicular and parallel to the surface of the support 101.

In the second layer region (S) provided on the first layer region (G), no germanium atom is contained. By forming a light receiving layer so as to have such a structure, the photoconductive member can be made to have an excellent photosensitivity to the light with wavelengths over the entire region from relatively shorter wavelength to relatively longer wavelength.

Also, since the germanium atoms are distributed in the first layer region (G) in such a state that the germanium atoms are continuously distributed throughout the entire layer region, when using a light source such as semiconductor laser, the light on the longer wavelength side which cannot substantially be absorbed by the second layer region (S) can be substantially completely absorbed in the first layer region (G), whereby the interference by reflection from the support surface can be prevented.

The content of silicon atoms contained in the first layer region [$(N_{Si}/N_{Si}+N_{Ge})$ wherein NA means the total number of atoms of A atom in the layer] can be determined as desired so that the objects of the present invention can be accomplished effectively, but generally $5\times10^4$ atomic ppm or less, preferably $1\times10^4$ atomic ppm or less, most preferably $1\times10^3$ atomic ppm or less. That is, as the value of x in a-$Ge_xSi_{1-x}$(H, X), it may generally be $0.95<X\leqq 1$, preferably $0.99<X<1$, most preferably $0.999<X\leqq 1$.

In the present invention, sufficient care should be paid in designing of the photoconductive member to the layer thicknesses of the first layer region (G) and the second layer region (S), which are one of important factors to accomplish effectively the objects of the present invention, so that desired characteristics may sufficiently given to the photoconductive member formed.

The layer thickness $T_B$ of the first layer region (G) should preferably be 30 Å to 50μ, more preferably 40 Å to 40μ, most preferably 50 Å to 30μ.

On the other hand, the layer thickness of the second layer region (S) should preferably be 0.5 to 90μ, more preferably 1 to 80μ, most preferably 2 to 50μ.

The sum of the layer thickness $T_B$ of the first layer region (G) and the thickness T of the second layer region (S), namely $(T_B+T)$ is determined suitably as desired during layer design of the photoconductive member, based on the relationship mutually between the characteristics required for the both layer regions and the characteristics required for the light receiving layer as a whole.

In the photoconductive member, the numerical range of the above $(T_B+T)$ may preferably be 1 to 100μ, more preferably 1 to 80μ, most preferably 2 to 50μ.

In more preferable embodiments of the present invention, it is desirable to select suitably appropriate numerical values for the above layer thicknesses $T_B$ and T, while satisfying preferably the relation of $T_B/T\leqq 1$.

In selection of the numerical values of the layer thickness $T_B$ and the layer thickness T in the above-mentioned case, the values of the layer thickness $T_B$ and the layer thickness T should desirably be determined, while satisfying more preferably the relation of $T_B/T<=0.9$, most preferably the relation of $T_B/T\leqq 0.8$.

In the present invention, the layer thickness $T_B$ of the first layer region (G) is desired to be made considerably thin, preferably 30μ or less, more preferably 25μ or less, most preferably 20μ or less.

Typical examples of the halogen atom (X) to be incorporated, if desired, in the first layer region (G) and the second layer region (S) constituting the light receiving layer may include fluorine, chlorine, bromine and iodine, particularly preferably fluorine and chlorine.

Formation of a first layer region (G) formed of a-$Ge_xSi_{1-x}$(H, X) $(0.95<X\leqq 1)$ may be conducted according to the vacuum deposition method utilizing discharging phenomenon, such as glow discharge method, sputtering method or ion-plating method.

For example, for formation of the first layer region (G) constituted of a-$Ge_xSi_{1-x}$(H, X) according to the glow discharge method, in the case of $0.95<X<1$, a starting gas for Ge supply capable of supplying germanium atoms (Ge) and a starting gas for Si supply capable of supplying silicon atoms (Si) together with, if necessary, a starting gas for introduction of hydrogen atoms (H) or/and halogen atoms (X) may be introduced into the deposition chamber which can be internally brought to a reduced pressure, and glow discharge excited in said deposition chamber, thereby forming a layer consisting of a-$Ge_xSi_{1-x}$(H,X) on the surface of a support set at a predetermined position.

In the case of $x=1$, the gas for supply of Si may be omitted from the starting gases as mentioned above.

For formation of the first layer region (G) according to the sputtering method, by use of one sheet of a target constituted of Ge or two sheets of said target and a target constituted of Si or one sheet of a target containing a mixture of Si and Ge in an atmosphere of inert gas such as Ar, He or a gas mixture based on these gases, a starting gas for Ge supply optionally diluted with a diluting gas such as Ar, He, etc. may be introduced together with, if necessary, a gas for introduction of hydrogen atoms (H) or/and halogen atoms (X) into the deposition chamber for sputtering to form a desired gas plasma atmosphere, followed by sputtering of the aforesaid target therein.

In the case of the ion plating method the same procedure can be followed as in the case of sputtering, except for using, for example, a polycrystalline germanium or a single crystalline germanium and, if necessary, a polycrystalline silicon or a single crystalline silicon, placing each material in a vapor deposition boat, heating the vaporizing source according to the resistance heating method or the electron beam method (EB method) to vaporize the material and permitting the flying vaporized product to pass through a desired gas plasma atmosphere.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred with respect to easy handling during layer formation and efficiency for supplying Si.

As the substances which can be starting gases for Ge supply, there may be included gaseous or gasifiable hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$ and the like as effective ones. In particular, for easiness in handling during layer forming operations and efficiency in supplying $GeH_4$, $Ge_2H_6$ and $Ge_3H_8$ are preferred.

Effective starting gases for introduction of halogen atoms to be used in the present invention may include a large number of halogen compounds, as exemplified by halogen gases, halides, interhalogen compounds, or gaseous or gasifiable halogen compounds such as silane derivatives substituted with halogens.

Further, there may also be included gaseous or gasifiable silicon compounds containing halogen atoms constituted of silicon atoms and halogen atoms as constituent elements as effective ones in the present invention.

Typical examples of halogen compounds preferably used in the present invention may include halogen gases such as of fluorine, chlorine, bromine or iodine, inerhalogen compounds such as BrF, ClF, $ClF_3$, $BrF_5$, $BrF_3$, $IF_3$, $IF_7$, $IC_1$, IBr, etc.

As the silicon compounds containing halogen atoms, namely so called silane derivatives substituted with halogens, there may preferably be employed silicon halides such as $SiF_4$, $Si_2F_6$, $SiCl_4$, $SiBr_4$ and the like.

When the characteristic photoconductive member of the present invention is to be formed according to the glow discharge method by employment of such a silicon compound containing halogen atoms, it is possible to form a first layer region (G) constituted of a-$Ge_xSi_{1-x}$ on a desired support without use of a hydrogenated silicon gas as the starting material capable of supplying Si together with a starting gas for Ge supply.

For formation of a first layer region (G) containing halogen atoms according to the glow discharge method, the basic procedure comprises introducing a silicon halide gas as the starting gas for Si supply, a hydrogenated germanium as the starting gas for Ge supply and a gas such as Ar, $H_2$, He, etc. at a predetermined mixing ratio and gas flow rates into a deposition chamber for formation of the first layer region (G) and exciting glow discharging therein to form a plasma atmosphere of these gases, whereby the first layer region (G) can be formed on a certain support. For the purpose of controlling more easily the ratio of hydrogen atoms introduced, these gases may further be admixed at a desired level with a gas of a silicon compound containing hydrogen atoms.

Also, the respective gases may be used not only as single species but as a mixture of plural species.

In either of the sputtering method or the ion plating method, introduction of halogen atoms into the layer formed may be effected by introducing a gas of a halogen compound or a silicon compound containing halogen atoms as described above into the deposition chamber and forming a plasma atmosphere of said gas.

Also, for introduction of hydrogen atoms, a starting gas for introduction of hydrogen atoms, such as $H_2$, or a gas of silanes or/and hydrogenated germanium such as those mentioned above may be introduced into the deposition chamber and a plasma atmosphere of said gas may be formed therein.

In the present invention, as the starting gas for introduction of halogen atoms, the halogen compounds or silicon compounds containing halogens as mentioned above can effectively be used. In addition, it is also possible to use a gaseous or gasifiable substance such as hydrogen halide, including HF, HCl, HBr, HI and the like or halo-substituted hydrogenated silicon, including $SiH_2F_2$, $SiH_2I_2$, $SiH_2Cl_2$, $SiHCl_3$, $SiH_2Br_2$, $SiHBr_3$ and the like, hydrogenated germanium halides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, $GeH_3I$ and the like, germanium halides such as $GeF_4$, $GeCl_4$, $GeBr_4$, $GeI_4$, $GeF_2$, $GeCl_2$, $GeBr_2$, $GeI_2$, and so on as an effective starting material for formation of a first amorphous layer region (G).

Among these substances, halides containing hydrogen atom, which can introduce hydrogen atoms very effective for controlling electrical or photoelectric characteristics into the layer during formation of the first layer region (G) simultaneously with introduction of halogen atoms, can preferably be used as the starting material for introduction of halogen atoms.

For incorporation of hydrogen atoms structurally into the first layer region (G), other than the above method, $H_2$ or a gas of hydrogenated silicon, including $SiH_4$, $Si_2H_6$, $Si_3H_8$ and $Si_4H_{10}$ and the like and germanium or a germanium compound for supplying Ge, or alternatively a hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$ and the like and silicon or a silicon compound for supplying Si may be permitted to be co-present in a deposition chamber, wherein discharging is excited.

In preferred embodiments of this invention, the amount of hydrogen atoms (H) or halogen atoms (X) incorporated in the first layer region (G) constituting the photoconductive member formed, or total amount (H+X), may be preferably 0.01 to 40 atomic %, more preferably 0.05 to 30 atomic %, most preferably 0.1 to 25 atomic %.

For controlling the amounts of hydrogen atoms (H) or/and halogen atoms (X) in the first layer region (G), the support temperature or/and the amounts of the starting materials for incorporation of hydrogen atoms (H) or halogen atoms (X) to be introduced into the deposition device system or the discharging power may be controlled.

In the present invention, for formation of the second layer region (S) formed of a-Si(H,X), the starting materials selected from among the starting materials (I) for formation of the first layer region (G) as described above except for the starting material as the starting gas for Ge supply [the starting materials (II) for formation of the second layer region (S)] are employed, following the same method and conditions in case of formation of the first layer region (G).

That is, in the present invention, formation of a second layer region (S) formed of a-Si(H, X) may be conducted according to the vacuum deposition method utilizing discharging phenomenon, such as glow discharge method, sputtering method or ion-plating method. For example, for formation of the second layer region (S) constituted of a-Si(H, X) according to the glow discharge method, the basic procedure comprises introducing a starting gas for Si supply capable of supplying silicon atoms (Si) together with, if necessary, a starting gas for introduction of hydrogen atoms (H) or/and halogen atoms (X) into the deposition chamber which can be internally brought to a reduced pressure, and exciting glow discharge in said deposition chamber, thereby forming a layer consisting of a-Si(H,X) on the surface of a support set a predetermined position. For formation of the layer according to the sputtering method, when effecting sputtering by use of a target constituted of Si in an atmosphere of, for example, an inert gas such as Ar, He, etc. or a gas mixture based on these gases, a gas for introduction of hydrogen atoms (H) or/and halogen atoms (X) may be introduced into the deposition chamber for sputtering.

In the present invention, the amount of hydrogen atoms (H) or the amount of halogen atoms (X) or the total amount of (H+X) to be contained in the second layer region (S) constituting the light receiving layer formed may preferably be 1 to 40 atomic %, more preferably 5 to 30 atomic %, most preferably 5 to 25 atomic %.

In the photoconductive member 100 shown in FIG. 1, a substance (C) for controlling the conductive characteristics can also be incorporated at least in the first layer region (G) 103 to impart desired conductive characteristics to the first layer region (G) 103.

In such a case, the substance (C) for controlling the conductive characteristics to be contained in the first layer region (G) 103 may be contained evenly within the whole of the first layer region (G) 103 or locally in a part of the first layer region (G) 103.

When the substance (C) for controlling the conductive characteristics is incorporated locally in a part of the first layer region (G) in the present invention, the layer region (PN) containing the aforesaid substance (C) may desirably be provided as an end portion region of the first layer region (G). In particular, when the aforesaid layer region (PN) is provided as the end portion layer region on the support side of the first layer region (G), injection of charges of a specific polarity from the support into the said layer region (PN) can be effectively inhibited by selecting suitably the kind and the content of the aforesaid substance (C) to be contained in said layer region (PN).

The substance (C) capable of controlling the conductive characteristics may be incorporated in the first layer region (G) constituting a part of the light receiving layer either evenly throughout the whole region or locally in the direction of layer thickness. Further, alternatively, the aforesaid substance (C) may also be incorporated in the second layer region (S) provided on the first layer region (G).

When the aforesaid substance (C) is to be incorporated in the second layer region (S), the kind and the content of the substance (C) to be incorporated in the second layer region (S) as well as its mode of incorporation may be determined suitably depending on the kind and the content of the substance (C) incorporated in the first layer region (G) as well as its mode of incorporation.

When the aforesaid substance (C) is to be incorporated in the second layer region (S), it is preferred that the aforesaid substance (C) should be incorporated within the layer region containing at least the contact interface with the first layer region (G).

The aforesaid substance (C) may be contained evenly throughout the whole layer region of the second layer region (S) or alternatively uniformly in a part of the layer region.

When the substance (C) for controlling the conductive characteristics is to be incorporated in both of the first layer region (G) and the second layer region (S), it is preferred that the layer region containing the aforesaid substance (C) in the first layer region (G) and the layer region containing the aforesaid substance (C) in the second layer region (S) may be contacted with each other.

The aforesaid substance (C) to be incorporated in the first layer region (G) may be either the same as or different from in kind that in the second layer region (S), and their contents may also be the same or different in respective layer regions.

However, it is preferred that the content in the first layer region (G) should be made sufficiently greater when the same kind of the aforesaid substance (C) is employed in respective layer regions, or that different kinds of substance (C) with different electrical characteristics should be incorporated in desired respective layer regions.

By incorporating the substance (C) for controlling the conductive characteristics in at least the first layer region (G) constituting the light-receiving layer, the conductive characteristics of the layer region containing said substance (C) [either a part or whole of the first layer region (G)] can freely be controlled as desired. As such a substance (C), there may be mentioned so called impurities in the field of semiconductors. In the present invention, there may be included p-type impurities giving p-type conductive characteristics and n-type impurities giving n-type conductive characteristics to Si and Ge constituting the light-receiving layer to be formed.

More specifically, there may be mentioned as p-type impurities atoms belonging to the group III of the periodic table (Group III atoms), such as B (boron), Al (aluminum), Ga (gallium), In (indium), Tl (thallium), etc., particularly preferably B and Ga.

As n-type impurities, there may be included the atoms belonging to the group V of the periodic table, such as P (phosphorus), As (arsenic), Sb (antimony), Bi (bismuth), etc., particularly preferably P and As.

In the present invention, the content of the substance (C) for controlling the conductive characteristics in said layer region (PN) may be suitably be selected depending on the conductive characteristics required for said layer region (PN), or when said layer region (PN) is provided in direct contact with the support, depending on the organic relation such as the relation with the characteristics at the contacted interface with the support.

The content of the substance for controlling the conductive characteristics may be suitably selected also with consideration about other layer regions provided in direct contact with said layer region (PN) and the relationship with the characteristics at the contacted interface with said other layer regions.

The content of the substance (C) for controlling the conductive characteristics in the layer region (PN) may be preferably 0.01 to $5\times10^4$ atomic ppm, more preferably 0.5 to $1\times10^4$ atomic ppm, most preferably 1 to $5\times10^3$ atomic ppm.

By making the content of the substance (C) for controlling the conductive characteristics in the layer region (PN) preferably 30 atomic ppm or more, more preferably 50 atomic ppm or more, most preferably 100 atomic ppm or more, in case, for example, when said substance (C) to be incorporated is a p-type impurity, injection of electrons from the support side into the light receiving layer can be effectively inhibited when the free surface of the light receiving layer is subjected to the charging treatment at $\oplus$ polarity, or in case when the aforesaid substance (C) to be incorporated is an n-type impurity, injection of holes can be effectively inhibited from the support side into the receiving layer when the free surface of the light receiving layer is subjected to the charging treatment at $\ominus$ polarity.

In the above cases, as described previously, the layer region (Z) excluding the aforesaid layer region (PN) may contain a substance (C) for controlling the conductive characteristics with a conduction type of a polarity different from that of the substance (C) for controlling the characteristics contained in the layer region (PN), or a substance (C) for controlling the conductive characteristics with a conduction type of the same polarity in an amount by far smaller than the practical amount to be contained in the layer region (PN).

In such a case, the content of the substance (C) for controlling the conductive characteristics to be contained in the aforesaid layer region (Z), which may suitably be determined as desired depending on the polarity and the content of the aforesaid substance (C) contained in the layer region (PN), may be preferably 0.001 to $1\times10^4$ atomic ppm, more preferably 0.05 to 500 atomic ppm, most preferably 0.1 to 200 atomic ppm.

In the present invention, when the same kind of the substance (C) for controlling the conductive characteristics in the layer region (PN) and the layer region (Z), the content in the layer region (Z) may preferably be 300 atomic ppm or less.

In the present invention, by providing in the light receiving layer a layer region containing a substance for controlling the conductive characteristics having a conduction type of the polarity and a layer region containing a substance for controlling the conductive characteristics having a conduction type of the other polarity in direct contact with each other, there can also be provided a so called depletion layer at said contacted region.

In short, for example, a depletion layer can be provided in the light receiving layer by providing a layer region containing the aforesaid p-type impurity and a layer region containing the aforesaid n-type impurity so as to be directly contacted with each other thereby to form a so called p-n junction.

In the photoconductive member of the present invention shown in FIG. 1, for the purpose of improvements to higher photosensitivity, higher dark resistance and, further, improvement of adhesion between the support and the light receiving layer, it is possible to incorporate oxygen atoms in the light receiving layer. The oxygen atoms contained in the light receiving layer may be contained either evenly throughout the whole layer region of the light receiving layer or locally only in a part of the layer region of the light receiving layer.

The oxygen atoms may be distributed in the direction of layer thickness of the light receiving layer such that the concentration C (O) may be either uniform or ununiform.

The layer region (O) constituting the light receiving layer containing oxygen atoms, when improvements of photosensitivity and dark resistance are primarily intended, is provided so as to comprise the whole layer region of the light receiving layer, while it is provided so as to comprise the end portion layer region on the support side of the light receiving layer, when reinforcement of adhesion between the support and the light receiving layer is primarily intended.

In the former case, the content of oxygen atoms in the layer region (O) may be desirably kept relatively smaller in order to maintain high photosensitivity, while in the latter case relatively large for ensuring reinforcement of adhesion with the support.

Also, for the purpose accomplishing both of the former and latter, oxygen atoms may be distributed in the layer region (O) so that they may be distributed in a relatively higher concentration on the support side, in a relatively lower on the free surface side, or no oxygen atom may be positively included in the layer region on the free surface side of the light receiving layer.

In the present invention, the content of oxygen atoms to be contained in the layer region (O) provided on the light receiving layer may be suitably selected depending on the characteristics required for the layer region (O) per se or, when said layer region (O) is provided in direct contact with the support, depending on the organic relationship such the relation with the characteristics at the contacted interface with said support and others.

When, another layer region is to be provided in direct contact with said layer region (O), the content of oxygen atoms may be suitably selected also with considerations about the characteristics of said another layer region and the relation with the characteristics of the contacted interface with said another layer region. The content of oxygen atoms in the layer region (O), which may suitably be determined as desired depending on the characteristics required for the photoconductive member to be formed, may be preferably 0.001 to 50 atomic %, more preferably 0.002 to 40 atomic %, most preferably 0.003 to 30 atomic %.

When the layer region (O) comprises the whole region of the light receiving layer or when, although it does not comprises the whole layer region, the layer thickness $T_o$ of the layer region (O) is sufficiently large relative to the layer thickness T of the light receiving layer, the upper limit of the content of oxygen atoms in the layer region (O) should desirably be sufficiently smaller than the aforesaid value.

In the case of the present invention, in such a case when the ratio of the layer thickness $T_o$ of the layer region (O) relative to the layer thickness T of the light receiving layer is 2/5 or higher, the upper limit of the content of oxygen atoms in the layer region may preferably be 30 atomic % or less, more preferably 20 atomic % or less, most preferably 10 atomic % or less.

FIGS. 2 through 10 show typical examples of distribution in the direction of layer thickness of oxygen atoms contained in the layer region (O).

In FIGS. 2 through 10, the axis of abscissa indicates the content C(O) of oxygen atoms and the axis of ordinate the layer thickness of the layer region (O), $t_B$ showing the position of the end surface of the layer region (O) on the support side and $t_T$ the position of the end surface of the first layer region (O) on the side opposite to the support side. That is, layer formation of the layer region (O) containing oxygen proceeds from the $t_B$ side toward the $t_T$ side.

Figure 2:
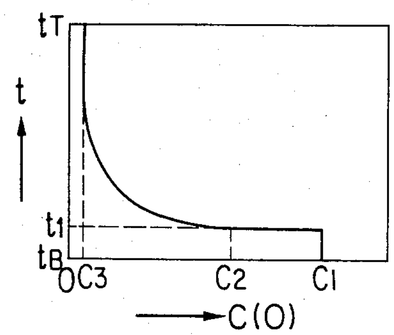
FIGS. 2 through 10 schematic sectional views for illustration of the depth profiles of oxygen atoms in the layer region (O), respectively.

In FIG. 2, there is shown a first typical embodiment of the depth profile of oxygen atoms in the layer thickness direction contained in the layer region (O).

In the embodiment as shown in FIG. 2, from the interface position $t_B$ at which the surface, on which the layer region (O) containing oxygen atoms is to be formed, is contacted with the surface of said layer region (O) to the position $t_1$, the oxygen atoms are contained in the layer region (O) formed, while the concentration C(O) of oxygen atoms taking a constant value of $C_1$, and the concentration is gradually decreased from the concentration $C_2$ continuously from the position $t_1$ to the interface position $t_T$. At the interface position $t_T$, the concentration C(O) of oxygen atoms is made $C_3$.

Figure 3:
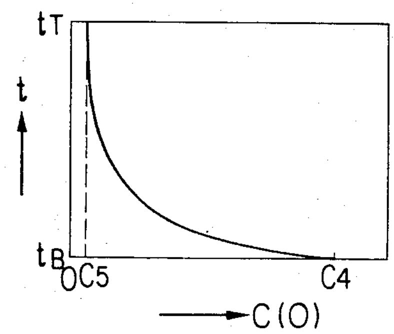

In the embodiment shown in FIG. 3, the concentration C(O) of oxygen atoms contained is decreased gradually and continuously from the position $t_B$ to the position $t_T$ from the concentration $C_4$ until it becomes the concentration $C_5$ at the position $t_T$.

Figure 4:
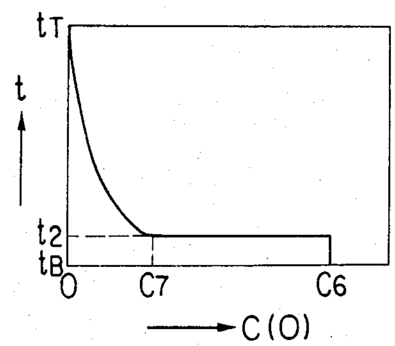

In case of FIG. 4, the concentration C(O) of oxygen atoms is made constant as $C_6$, gradually decreased from the position $t_2$ to the position $t_T$, and the concentration C(O) is made substantially zero at the position $t_T$ (substantially zero herein means the content less than the detectable limit).

Figure 5:
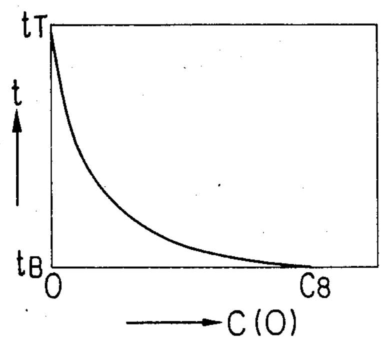

In case of FIG. 5, the concentration C(O) of oxygen atoms are decreased gradually and continuously from the position $t_B$ to the position $t_T$ from the concentration $C_8$, until it is made substantially zero at the position $t_T$.

Figure 6:
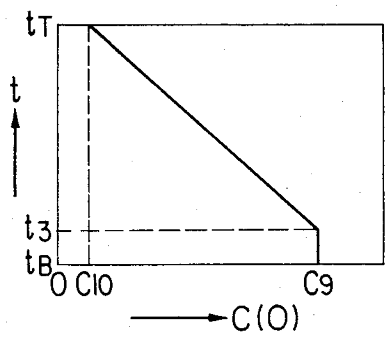

In the embodiment shown in FIG. 6, the concentration C(O) of oxygen atoms is constantly $C_9$ between the position $t_B$ and the position $t_3$, and it is made $C_{10}$ at the position $t_T$. Between the position $t_3$ and the position $t_T$, the concentration is decreased as a linear function from the position $t_3$ to the position $t_T$.

Figure 7:
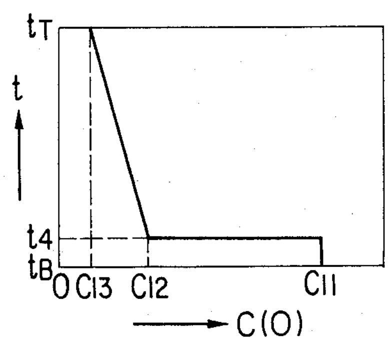

In the embodiment shown in FIG. 7, there is formed a depth profile such that the concentration C(O) takes a constant value of $C_{11}$ from the position $t_B$ to the position $t_4$, and is decreased as a linear function from the concentration $C_{12}$ to the concentration $C_{13}$ from the position $t_4$ to the position $t_T$.

Figure 8:
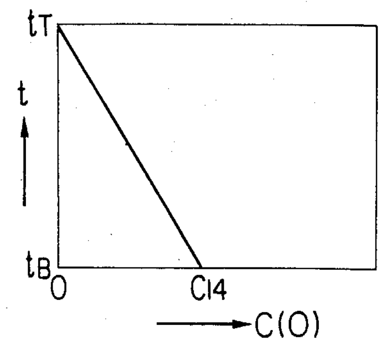

In the embodiment shown in FIG. 8, the concentration C(O) of oxygen atoms is decreased as a linear function from the concentration $C_{14}$ to zero from the position $t_B$ to the position $t_T$.

Figure 9:
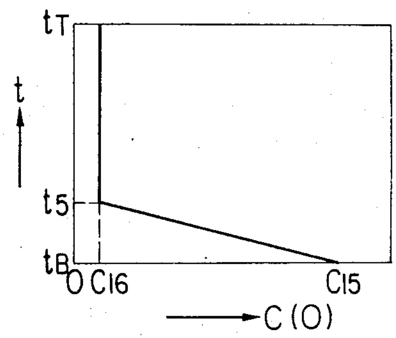

In FIG. 9, there is shown an embodiment, where the concentration C(O) of oxygen atoms from the position $t_B$ to $t_5$ is decreased as a linear function from the concentration $C_{15}$ to $C_{16}$ and made constantly at the concentration $C_{16}$ between the position $t_5$ and $t_T$.

Figure 10:
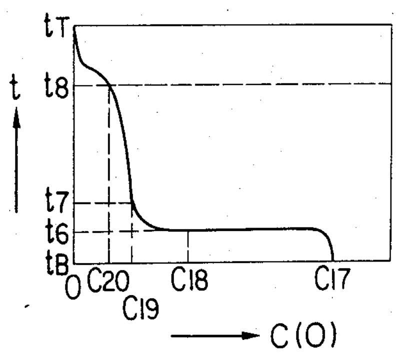

In the embodiment shown in FIG. 10, the concentration C(O) of oxygen atoms is at the concentration $C_{17}$ at the position $t_B$, which concentration $C_{17}$ is initially decreased gradually and abruptly near the position $t_6$ to the position $t_6$, until it is made the concentration $C_{18}$ at the position $t_6$. Between the position $t_6$ and the position $t_7$, the concentration is initially decreased abruptly and thereafter gradually, until it is made the concentration $C_{19}$ at the position $t_7$. Between the position $t_7$ and the position $t_8$, the the concentration is decreased very gradually to the concentration $C_{20}$ at the position $t_8$. Between the position $t_8$ and the position $t_T$, the concentration is decreased along the curve having a shape as shown in the Figure from the concentration $C_{20}$ to substantially zero.

As described above about some typical examples of depth profiles of oxygen atoms contained in the layer region (O) in the direction of the layer thickness by referring to FIGS. 2 through 10, in the present invention, the layer region (O) is provided desirably in a depth profile so as to have a portion enriched in concentration C(O) of oxygen atoms on the support side and a portion depleted in concentration C(O) of oxygen atoms to considerably lower than that of the support side on the interface $t_T$ side.

The layer region (O) may preferably be provided so as to have a localized region (B) containing oxygen atoms at a relatively higher concentration on the support side, and in this case adhesition between the support and the light receiving layer can be further improved.

The localized region (B), as explained in terms of the symbols shown in FIG. 2 through FIG. 10, may be desirably provided within 5μ from the interface position $t_B$.

In the present invention, the above localized region (B) may be made to be identical with the whole layer region ($L_T$) up to the depth of 5μ thickness from the interface position $t_B$, or alternatively a part of the layer region ($L_T$).

It may suitably be determined depending on the characteristics required for the light receiving layer to be formed, whether the localized region (B) may be made a part or whole of the layer region ($L_T$).

The localized region (B) may preferably be formed according to such a layer formation that the maximum $C_{max}$ of the concentrations of oxygen atoms in a distribution in the layer thickness direction (depth profile values) may preferably be 500 atomic ppm or more, more preferably 800 atomic ppm or more, most preferably 1000 atomic ppm or more.

That is, according to the present invention, the layer region (O) containing oxygen atoms is formed so that the maximum value $C_{max}$ of the depth profile may exist within a layer thickness of 5μ from the support side (the layer region within 5μ thickness from $t_B$).

For formation of the layer region (O) containing oxygen atoms in the light receiving layer, a starting material for introduction of oxygen atoms may be used together with the starting material for formation of the light receiving layer as mentioned above during formation of the layer and may be incorporated in the layer while controlling their amounts. When the glow discharge method is to be employed for formation of the layer region (O), the starting material as the starting gas for formation of the layer region (O) may be constituted by adding a starting material for introduction of oxygen atoms to the starting material selected as desired from those for formation of the light receiving layer as mentioned above. As such a starting material for introduction of oxygen atoms, there may be employed most of gaseous or gasifiable substances containing at least oxygen atoms as constituent atoms.

For example, there may be employed a mixture of a starting gas containing silicon atoms (Si) as constitutent atoms, a starting gas containing oxygen atoms (O) as constituent atoms and optionally a starting gas containing hydrogen atoms (H) or/and halogen atoms (X) as constituent atoms at a desired mixing ratio; a mixture of a starting gas containing silicon atoms (Si) as constituent atoms and a starting gas containing oxygen atoms (O) and hydrogen atoms (H) as constituent atoms also at a desired mixing ratio; or a mixture of a starting gas containing silicon atoms (Si) as constituent atoms and a starting gas containing the three atoms of silicon atoms (Si), oxygen atoms (O) and hydrogen atoms (H) as constituent atoms.

Alternatively, there may also be employed a mixture of a starting gas containing silicon atoms (Si) and hydrogen atoms (H) as constituent atoms and a starting gas containing oxygen atoms (O) as constituent atoms.

More specifically, there may be mentioned, for example, oxygen ($O_2$), ozone ($O_3$), nitrogen monooxide (NO), nitrogen dioxide ($NO_2$), dinitrogen monooxide ($N_2O$), dinitrogen trioxide ($N_2O_3$), dinitrogen tetraoxide ($N_2O_4$), dinitrogen pentaoxide ($N_2O_5$), nitrogen trioxide ($NO_3$), and lower siloxanes containing silicon atoms (Si), oxygen atoms (O) and hydrogen atoms (H) as constituent atoms such as disiloxane ($H_3SiOSiH_3$), trisiloxane ($H_3SiOSiH_2OSiH_3$), and the like.

For formation of the layer region (O) containing oxygen atoms according to the sputtering method, a single crystalline or polycrystalline Si wafer or $SiO_2$ wafer or a wafer containing Si and $SiO_2$ mixed therein may be employed as the target and sputtering of these wafers may be conducted in various gas atmospheres.

For example, when Si wafer is employed as the target, a starting gas for introduction of oxygen atoms optionally together with a starting gas for introduction of hydrogen atoms or/and halogen atoms, which may optionally be diluted with a diluting gas, may be introduced into a deposition chamber for sputtering to form gas plasma of these gases, in which sputtering of the aforesaid Si wafer may be effected.

Alternatively, by use of separate targets of Si and $SiO_2$ or one sheet of a target containing Si and $SiO_2$ mixed therein, sputtering may be effected in an atmosphere of a diluting gas as a gas for sputtering or in a gas atmosphere containing at least hydrogen atoms (H) or/and halogen atoms (X) as constituent atoms. As the starting gas for introduction of oxygen atoms, there may be employed the starting gases shown as examples in the glow discharge method previously described also as effective gases in case of sputtering.

When providing a layer region (O) containing oxygen atoms during formation of the light receiving layer, formation of the layer region (O) having a desired depth profile in the direction of layer thickness formed by varying the distribution concentration C(O) of oxygen atoms contained in said layer region (O) may be conducted in case of glow discharge by introducing a starting gas for introduction of oxygen atoms of which the distribution concentration C(O) is to be varied into a deposition chamber, while varying suitably its gas flow rate according to a desired change rate curve. For example, by the manual method or any other method conventionally used such as an externally driven motor, etc., the opening of certain needle valve provided in the course of the gas flow channel system may be gradually varied. During this procedure, the rate of variation is not necessarily required to be linear, but the flow rate may be controlled according to a variation rate curve previously designed by means of, for example, a microcomputer to give a desired content curve.

In case when the layer region (O) is formed by the sputtering method, formation of a desired depth profile of oxygen atoms in the direction of layer thickness by varying the distribution concentration C(O) of oxygen atoms in the direction of layer thickness may be performed first similarly as in case of the glow discharge method by employing a starting material for introduction of oxygen atoms under gaseous state and varying suitably as desired the gas flow rate of said gas when introduced into the deposition chamber.

Secondly, formation of such a depth profile can also be achieved by previously changing the composition of a target for sputtering. For example, when a target comprising a mixture of Si and $SiO_2$ is to be used, the mixing ratio of Si to $SiO_2$ may be varied in the direction of layer thickness of the target.

The support to be used in the present invention may be either electroconductive or insulating. As the electroconductive material, there may be mentioned metals such as NiCr, stainless steel, metals of Al, Cr, Mo, Au, Nb, Ta, V, Ti, Pt, Pd etc. or alloys thereof.

As insulating supports, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. These insulating supports should preferably have at least one surface subjected to electroconductive treatment, and it is desirable to provide other layers on the side at which said electroconductive treatment has been applied.

For example, electroconductive treatment on a glass can be effected by providing a thin film of NiCr, Al, Cr, Mo, Au, Ir, Nb, Ta, V, Ti, Pt, Pd, $In_2O_3$, $SnO_2$, ITO ($In_2O_3+SnO_2$) thereon. Alternatively, a synthetic resin film such as polyester film can be subjected to the treatment to provide electroconductivity on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The support may be shaped in any form such as cylinders, belts, plates or others, and its form may be determined as desired. For example, when the photoconductive member 100 in FIG. 1 is to be used as an image forming member for electrophotography, it may desirably be formed into an endless belt or a cylinder for use in continuous high speed copying. The support may have a thickness, which is conveniently determined so that a photoconductive member as desired may be formed. When the photoconductive member is required to have a flexibility, the support is made as thin as possible, so far as the function of a support can be exhibited. However, in such a case, the thickness is generally 10μ or more from the points of fabrication and handling of the support as well as its mechanical strength.

As described in detail above, the photoconductive member designed to have layer constitution of the present invention can overcome all of the problems as mentioned above and exhibit very excellent electrical, optical, photoconductive characteristics, dielectric strength, as well as good environmental characteristics in use.

In particular, when it is applied as an image forming member for electrophotography, it is excellent in charge retentivity in charging treatment without any influence of residual potential on image formation at all, being stable in its electrical properties with sensitivity and having high SN ratio as well as excellent light fatigue resistance and repeated usage characteristics, whereby it is possible to obtain images of high quality with high concentration, clear halftone and high resolution.

Also, in the photoconductive member of the present invention, the light receiving layer which is formed thereon is itself tough and markedly excellent in adhesion with the support, and therefore it can be used repeatedly at high speed for a long time continuously.

Further, the photoconductive member of the present invention is high in photosensitivity over the all visible light regions, particularly excellent in matching to semiconductor laser and also rapid in light response.

Next, an example of the process for producing the photoconductive member of this invention is to be briefly described.

Figure 11:
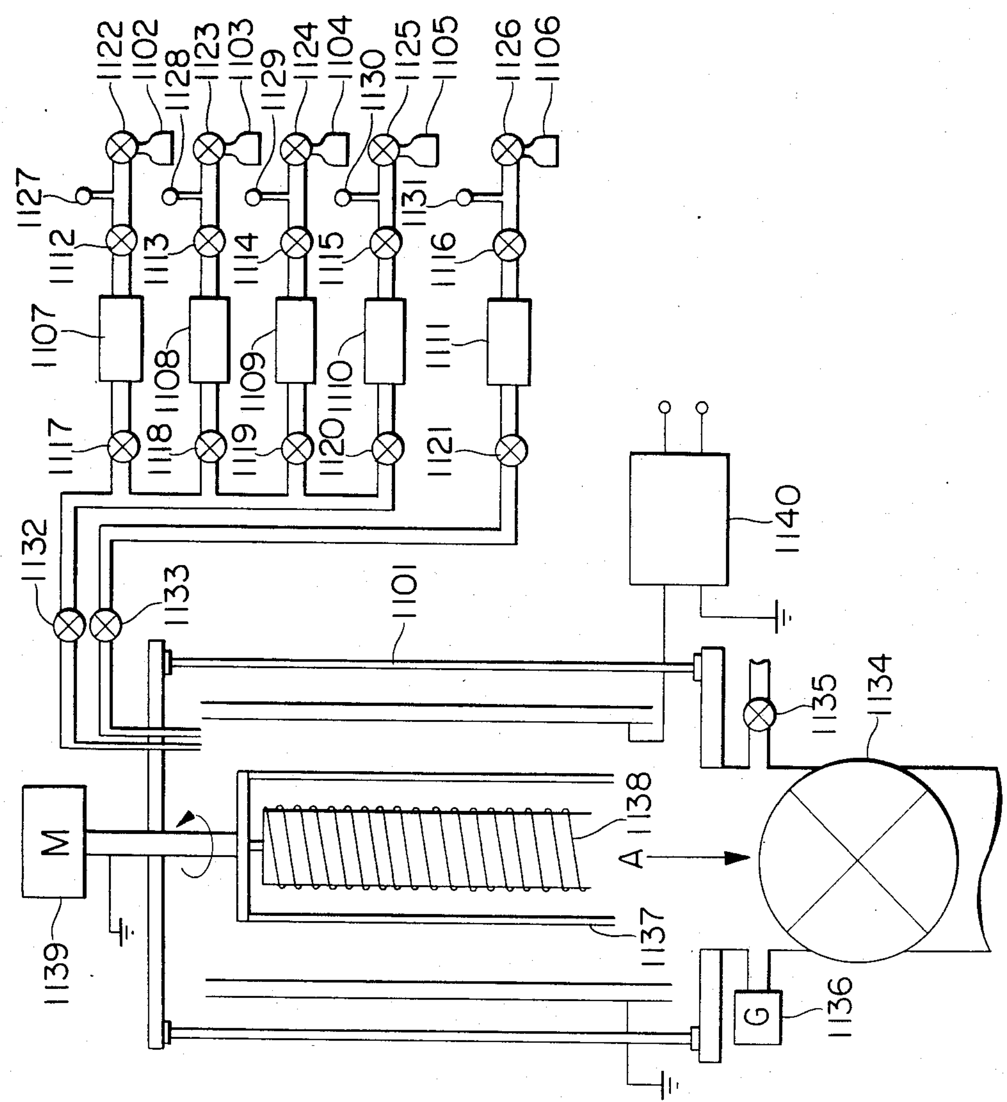
FIG. 11 a schematic flow chart for illustration of the device used for preparation of the photoconductive member of the present invention.

FIG. 11 shows one example of a device for producing a photoconductive member.

In the gas bombs 1102–1106 there are hermetically contained starting gases for formation of the photoconductive member of the present invention. For example, 1102 is a bomb containing $SiH_4$ gas diluted with He (purity: 99.999%, hereinafter abbreviated as "$SiH_4$/He"), 1103 is a bomb containing $GeH_4$ gas diluted with He (purity 99.999%, hereinafter abbreviated as "$GeH_4$/He"), 1104 is a bomb containing $B_2H_6$ gas diluted with He (purity: 99.999%, hereinafter abbreviated as "$B_2H_6$/He"), 1105 is a NO gas bomb (purity: 99.999%) and 1106 is a $H_2$ gas bomb (purity: 99.999%).

For allowing these gases to flow into the reaction chamber 1101, on confirmation of the valves 1122–1126 of the gas bombs 1102–1106 and the leak valve 1135 to be closed, and the inflow valves 1112–1116, the outflow valves 1117–1121 and the auxiliary valves 1132, 1133 to be opened, the main valve 1134 is first opened to evacuate the reaction chamber 1101 and the gas pipelines. As the next step, when the reading on the vacuum indicator 1136 becomes $5\times10^{-6}$ Torr, the auxiliary valves 1132, 1133 and the outflow valves 1117–1121 are closed.

Referring now to an example of forming a light receiving layer on the cylindrical substrate 1137, $SiH_4$/He gas from the gas bomb 1102, $GeH_4$/He gas from the gas bomb 1103, $B_2H_6$/He gas from the gas bomb 1104 and NO gas from the gas bomb 1105 are permitted to flow into the mass-flow controllers 1107 to 1110, respectively, by opening the valves 1122 to 1125 and controlling the pressures at the outlet pressure gauges 1127 to 1130 to 1 Kg/cm$^2$ and opening gradually the inflow valves 1112 to 1115, respectively. Subsequently, the outflow valves 1117 to 1120 and the auxiliary valve 1132 are gradually opened to permit respective gases to flow into the reaction chamber 1101. The outflow valves 1117 to 1120 are controlled so that the flow rate ratios of $SiH_4$/He:$GeH_4$/He:$B_2H_6$/He:NO may have desired values and opening of the main valve 1134 is also controlled while watching the reading on the vacuum indicator 1136 so that the pressure in the reaction chamber 1101 may reach a desired value. And, after confirming that the temperature of the substrate 1137 is set at 50°–400° C. by the heater 1138, the power source 1140 is set at a desired power to excite glow discharge in the reaction chamber 1101, and glow discharging is maintained for a desired period of time to form a layer region (B, O) constituted of a-$Ge_xSi_{1-x}$ (H, X) containing boron atoms (B) and oxygen atoms (O) to a desired thickness on the substrate 1137.

At the stage when the layer region (B, O) is formed in a desired layer thickness, following the same conditions and the procedure for closing completely the outflow valves 1118, 1119 and 1120 and changing the discharging conditions, glow discharging is maintained for a desired period of time, whereby a layer region (S) constituted of a-Si(H, X) containing none of boron atoms (B), oxygen atoms (O) and germanium atoms (Ge) is formed on the above layer region (B, O) to complete formation of the light-receiving layer.

During formation of the above light receiving layer, after commencement of forming said layer, by stopping inflow of $B_2H_6$/He gas or NO gas into the deposition chamber at the stage when a desired period has elapsed, each layer thickness of the layer region (B) containing boron atoms and the layer region (O) containing oxygen atoms can freely be controlled.

Also, according to a desired variation ratio curve, the gas flow rate of NO gas into the deposition chamber 1101 can be controlled to form the oxygen atoms contained in the layer region (O) to a desired depth profile.

During layer formation, it is desirable to rotate the substrate 1137 at a constant speed by the motor 1139 in order to effect layer formation uniformly.

The present invention is further illustrated by referring to the following Examples.

EXAMPLE 1

By means of the device as shown in FIG. 11, layers were formed on a cylindrical aluminum substrate under the conditions shown in Table 1A below to obtain an image forming member for electrophotography.

The thus obtained image forming member was set in an experimental device for charging exposure and corona charging was effected at ⊖5.0 KV for 0.3 sec, followed immediately by irradiation of a light image. The light image was irradiated by use of a tungsten lamp light source at a dose of 2 lux·sec through a transmissive type test chart.

Immediately thereafter, a positively chargeable developer (containing toner and carrier) was cascaded on the surface of the image forming member to obtain a good toner image on the surface of the image forming member. When the toner image on the image forming member was transferred by ⊖5.0 KV corona charging to a transfer paper, a clear image of high density excellent in resolution with good gradation reproducibility was obtained.

EXAMPLE 2

By means of the device shown in FIG. 11, an image forming member for electrophotography was obtained by performing layer formation according to the same procedure as in Example 1 except for changing the conditions to those shown in Table 2A.

For the image forming member thus obtained, an image was formed on a transfer paper according to the same procedure and under the same conditions as in Example 1, except for changing the charging polarity and the charged polarity of the developer to opposite polarities, respectively, whereby a very clear image quality was obtained.

EXAMPLE 3

By means of the device shown in FIG. 11, an image forming member for electrophotography was obtained by performing layer formation according to the same procedure as in Example 1 except for changing the conditions to those shown in Table 3A.

For the image forming member thus obtained, an image was formed on a transfer paper according to the same procedure and under the same conditions as in Example 1, whereby a very clear image quality was obtained.

EXAMPLE 4

Image forming members for electrophotography were prepared, respectively, according to the same procedure as in Example 1 except for changing the contents of germanium atoms contained in the first layer as shown by the contents of Si stated in Table 4A, by varying the flow rate ratio of $GeH_4$/He gas to $SiH_4$/He gas.

For the image forming members thus obtained, images were formed on transfer papers according to the same procedure and under the same conditions as in Example 1 to obtain the results as shown in Table 4A.

EXAMPLE 5

Image forming members for electrophotography were prepared, respectively, according to the same procedure as in Example 3 except for changing the layer thickness of the first layer as shown in Table 5A.

For the image forming members thus obtained, images were formed on transfer papers according to the same procedure and under the same conditions as in Example 1 to obtain the results as shown in Table 5A.

EXAMPLE 6

By means of the device as shown in FIG. 11, layers were formed on a cylindrical aluminum substrate under the conditions shown in Table 6A to obtain an image forming member for electrophotography.

The thus obtained image forming member was set in an experimental device for charging exposure and corona charging was effected at ⊖5.0 KV for 0.3 sec, followed immediately by irradiation of a light image. The light image was irradiated by use of a tungsten lamp light source at a dose of 2 lux·sec through a transmissive type test chart.

Immediately thereafter, a positively chargeable developer (containing toner and carrier) was cascaded on the surface of the image forming member to obtain a good toner image on the surface of the image forming member. When the toner image on the image forming member was transferred by ⊖5.0 KV corona charging to a transfer paper, a clear image of high density excellent in resolution with good gradation reproducibility was obtained.

EXAMPLE 7

In Example 1, an electrostatic image was formed by use of a GaAs type semiconductor laser at 810 nm (10 mW) was employed as the light source in place of the tungsten lamp, following otherwise the same toner image forming conditions as in Example 1, to prepare an image forming member for electrophotography. When image quality evaluation was conducted for the image forming member obtained, the image obtained was found to be excellent in resolution and of high quality, which was clear with good gradation reproducibility.

EXAMPLE 8

By means of the device as shown in FIG. 11, layers were formed on a cylindrical aluminum substrate under the conditions shown in Table 1B below to obtain an image forming member for electrophotography.

The thus obtained image forming member was set in an experimental device for charging exposure and corona charging was effected at ⊕5.0 KV for 0.3 sec, followed immediately by irradiation of a light image. The light image was irradiated by use of a tungsten lamp light source at a dose of 2 lux·sec through a transmissive type test chart.

Immediately thereafter, a negatively chargeable developer (containing toner and carrier) was cascaded on the surface of the image forming member to obtain a good toner image on the surface of the image forming member. When the toner image on the image forming member was transferred by ⊕5.0 KV corona charging to a transfer paper, a clear image of high density excellent in resolution with good gradation reproducibility was obtained.

EXAMPLE 9

By means of the device shown in FIG. 11, an image forming member for electrophotography was obtained by performing layer formation according to the same procedure as in Example 8 except for changing the conditions to those shown in Table 2B.

For the image forming member thus obtained, an image was formed on a transfer paper according to the same procedure and under the same conditions as in Example 8, except for changing the charging polarity and the charged polarity of the developer to opposite polarities, respectively, whereby a very clear image quality was obtained.

EXAMPLE 10

By means of the device shown in FIG. 11, an image forming member for electrophotography was obtained by performing layer formation according to the same procedure as in Example 8 except for changing the conditions to those shown in Table 3B.

For the image forming member thus obtained, an image was formed on a transfer paper according to the same procedure and under the same conditions as in Example 8, whereby a very clear image quality was obtained.

EXAMPLE 11

Image forming members for electrophotography were prepared, respectively, according to the same procedure as in Example 8 except for changing the contents of germanium atoms contained in the first layer as shown by the contents of Si stated in Table 4B, by varying the flow rate ratio of $GeH_4$/He gas to $SiH_4$/He gas.

For the image forming members thus obtained, images were formed on transfer papers according to the same procedure and under the same conditions as in Example 8 to obtain the results as shown in Table 4B.

EXAMPLE 12

Image forming members for electrophotography were prepared, respectively, according to the same procedure as in Example 8 except for changing the layer thickness of the first layer as shown in Table 5B.

For the image forming members thus obtained, images were formed on transfer papers according to the same procedure and under the same conditions as in Example 8 to obtain the results as shown in Table 5B.

EXAMPLE 13

By means of the device as shown in FIG. 11, layers were formed on a cylindrical aluminum substrate under the conditions shown in Table 6B to obtain an image forming member for electrophotography.

The thus obtained image forming member was set in an experimental device for charging exposure and corona charging was effected at ⊕5.0 KV for 0.3 sec, followed immediately by irradiation of a light image. The light image was irradiated by use of a tungsten lamp light source at a dose of 2 lux·sec through a transmissive type test chart.

Immediately thereafter, a negatively chargeable developer (containing toner and carrier) was cascaded on the surface of the image forming member to obtain a good toner image on the surface of the image forming member. When the toner image on the image forming member was transferred by ⊕5.0 KV corona charging to a transfer paper, a clear image of high density excellent in resolution with good gradation reproducibility was obtained.

EXAMPLE 14

By means of the device as shown in FIG. 11, layers were formed on a cylindrical aluminum substrate under the conditions shown in Table 7B to obtain an image forming member for electrophotography.

The thus obtained image forming member was set in an experimental device for charging exposure and corona charging was effected at ⊖5.0 KV for 0.3 sec, followed immediately by irradiation of a light image. The light image was irradiated by use of a tungsten lamp light source at a dose of 2 lux·sec through a transmissive type test chart.

Immediately thereafter, a positively chargeable developer (containing toner and carrier) was cascaded on the surface of the image forming member to obtain a good toner image on the surface of the image forming member. When the toner image on the image forming member was transferred by ⊖5.0 KV corona charging to a transfer paper, a clear image of high density excellent in resolution with good gradation reproducibility was obtained.

EXAMPLE 15

By means of the device as shown in FIG. 11, layers were formed on a cylindrical aluminum substrate under the conditions shown in Table 8B to obtain an image forming member for electrophotography.

The thus obtained image forming member was set in an experimental device for charging exposure and corona charging was effected at ⊖5.0 KV for 0.3 sec, followed immediately by irradiation of a light image. The light image was irradiated by use of a tungsten lamp light source at a dose of 2 lux·sec through a transmissive type test chart.

Immediately thereafter, a positively chargeable developer (containing toner and carrier) was cascaded on the surface of the image forming member to obtain a good toner image on the surface of the image forming member. When the toner image on the image forming member was transferred by ⊖5.0 KV corona charging to a transfer paper, a clear image of high density excellent in resolution with good gradation reproducibility was obtained.

EXAMPLE 16

By means of the device shown in FIG. 11, an image forming member for electrophotography was prepared according to the same procedure as in Example 8 except for changing the conditions to those as shown in Table 9B.

For the image forming member thus obtained, an image was formed on a transfer paper according to the same procedure and under the same conditions as in Example 8, whereby a very clear image quality was obtained.

EXAMPLE 17

By means of the device shown in FIG. 11, an image forming member for electrophotography was prepared according to the same procedure as in Example 8 except for changing the conditions to those as shown in Table 10B.

For the image forming member thus obtained, an image was formed on a transfer paper according to the same procedure and under the same conditions as in Example 8, whereby a very clear image quality was obtained.

EXAMPLE 18

In Example 8, an electrostatic image was formed by use of a GaAs type semiconductor laser at 810 nm (10 mW) was employed as the light source in place of the tungsten lamp, following otherwise the same toner image forming conditions as in Example 8, to prepare an image forming member for electrophotography. When image quality evaluation was conducted for the image forming member obtained, the image obtained was found to be excellent in resolution and of high quality, which was clear with good gradation reproducibility.

EXAMPLE 19

By means of the device as shown in FIG. 11, layers were formed on a cylindrical aluminum substrate under the conditions shown in Table 1C to obtain an image forming member for electrophotography.

The thus obtained image forming member was set in an experimental device for charging exposure and corona charging was effected at ⊖5.0 KV for 0.3 sec, followed immediately by irradiation of a light image. The light image was irradiated by use of a tungsten lamp light source at a dose of 2 lux·sec through a transmissive type test chart.

Immediately thereafter, a positively chargeable developer (containing toner and carrier) was cascaded on the surface of the image forming member to obtain a good toner image on the surface of the image forming member. When the toner image on the image forming member was transferred by ⊖5.0 KV corona charging to a transfer paper, a clear image of high density excellent in resolution with good gradation reproducibility was obtained.

EXAMPLE 20

By means of the device shown in FIG. 11, an image forming member for electrophotography was obtained by performing layer formation according to the same procedure as in Example 19 except for changing the conditions to those shown in Table 2C.

For the image forming member thus obtained, an image was formed on a transfer paper according to the same procedure and under the same conditions as in Example 19, except for changing the charging polarity and the charged polarity of the developer to opposite polarities, respectively, whereby a very clear image quality was obtained.

EXAMPLE 21

By means of the device shown in FIG. 11, an image forming member for electrophotography was obtained by performing layer formation according to the same procedure as in Example 19 except for changing the conditions to those shown in Table 3C.

For the image forming member thus obtained, an image was formed on a transfer paper according to the same procedure and under the same conditions as in Example 19, whereby a very clear image quality was obtained.

EXAMPLE 22

Image forming members for electrophotography were prepared, respectively, according to the same procedure as in Example 19 except for changing the contents of germanium atoms contained in the first layer as shown by the contents of Si stated in Table 4C, by varying the flow rate ratio of $GeH_4$/He gas to $SiH_4$/He gas.

For the image forming members thus obtained, images were formed on transfer papers according to the same procedure and under the same conditions as in Example 19 to obtain the results as shown in Table 4C.

EXAMPLE 23

Image forming members for electrophotography were prepared, respectively, according to the same procedure as in Example 19 except for changing the layer thickness of the first layer as shown in Table 5C.

For the image forming members thus obtained, images were formed on transfer papers according to the same procedure and under the same conditions as in Example 19 to obtain the results as shown in Table 5C.

EXAMPLE 24

By means of the device as shown in FIG. 11, layers were formed on a cylindrical aluminum substrate under the conditions shown in Table 6C to obtain an image forming member for electrophotography.

The thus obtained image forming member was set in an experimental device for charging exposure and corona charging was effected at ⊖5.0 KV for 0.3 sec, followed immediately by irradiation of a light image. The light image was irradiated by use of a tungsten lamp light source at a dose of 2 lux·sec through a transmissive type test chart.

Immediately thereafter, a positively chargeable developer (containing toner and carrier) was cascaded on the surface of the image forming member to obtain a good toner image on the surface of the image forming member. When the toner image on the image forming member was transferred by ⊖5.0 KV corona charging to a transfer paper, a clear image of high density excellent in resolution with good gradation reproducibility was obtained.

EXAMPLE 25

In Example 19, an electrostatic image was formed by use of a GaAs type semiconductor laser at 810 nm (10 mW) was employed as the light source in place of the tungsten lamp, following otherwise the same toner image forming conditions as in Example 19, to prepare an image forming member for electrophotography. When image quality evaluation was conducted for the image forming member obtained, the image obtained was found to be excellent in resolution and of high quality, which was clear with good gradation reproducibility.

EXAMPLE 26

By means of the device as shown in FIG. 11, layers were formed on a cylindrical aluminum substrate under the conditions shown in Table 1D below to obtain an image forming member for electrophotography.

The thus obtained image forming member was set in an experimental device for charging exposure and corona charging was effected at ⊕5.0 KV for 0.3 sec, followed immediately by irradiation of a light image. The light image was irradiated by use of a tungsten lamp light source at a dose of 2 lux·sec through a transmissive type test chart.

Immediately thereafter, a negatively charged developer (containing toner and carrier) was cascaded on the surface of the image forming member to obtain a good toner image on the surface of the image forming member. When the toner image on the image forming member was transferred by ⊕5.0 KV corona charging to a transfer paper, a clear image of high density excellent in resolution with good gradation reproducibility was obtained.

EXAMPLE 27

By means of the device shown in FIG. 11, an image forming member for electrophotography was obtained by performing layer formation according to the same procedure as in Example 26 except for changing the conditions to those shown in Table 2D.

For the image forming member thus obtained, an image was formed on a transfer paper according to the same procedure and under the same conditions as in Example 26, except for changing the charging polarity and the charged polarity of the developer to opposite polarities, respectively, whereby a very clear image quality was obtained.

EXAMPLE 28

By means of the device shown in FIG. 11, an image forming member for electrophotography was obtained by performing layer formation according to the same procedure as in Example 26 except for changing the conditions to those shown in Table 3D.

For the image forming member thus obtained, an image was formed on a transfer paper according to the same procedure and under the same conditions as in Example 26, whereby a very clear image quality was obtained.

EXAMPLE 29

Image forming members for electrophotography were prepared, respectively, according to the same procedure as in Example 26 except for changing the contents of germanium atoms contained in the first layer as shown by the contents stated in Table 4D by varying the flow rate ratio of $GeH_4/He$ gas to $SiH_4/He$ gas.

For the image forming members thus obtained, images were formed on transfer papers according to the same procedure and under the same conditions as in Example 26 to obtain the results as shown in Table 4D.

EXAMPLE 30

Image forming members for electrophotography were prepared, respectively, according to the same procedure as in Example 26 except for changing the layer thickness of the first layer as shown in Table 5D.

For the image forming members thus obtained, images were formed on transfer papers according to the same procedure and under the same conditions as in Example 26 to obtain the results as shown in Table 5D.

EXAMPLE 31

By means of the device as shown in FIG. 11, layers were formed on a cylindrical aluminum substrate under the respective conditions shown in Table 6D to Table 8D to obtain image forming members for electrophotography, respectively (Sample Nos. 601D, 602D and 603D).

Each of the thus obtained image forming members was set in an experimental device for charging exposure and corona charging was effected at ⊖5.0 KV for 0.3 sec, followed immediately by irradiation of a light image. The light image was irradiated by use of a tungsten lamp light source at a dose of 2 lux·sec through a transmissive type test chart.

Immediately thereafter, a positively chargeable developer (containing toner and carrier) was cascaded on the surface of the image forming member to obtain a good toner image on the surface of the image forming member. When the toner image on the image forming member was transferred by ⊖5.0 KV corona charging to a transfer paper, a clear image of high density excellent in resolution with good gradation reproducibility was obtained.

EXAMPLE 32

By means of the device as shown in FIG. 11, layers were formed according to the same procedure as in Example 26 except for changing the respective conditions shown in Table 9D and Table 10D to obtain image forming members for electrophotography, respectively (Sample Nos. 701D and 702D).

For each of the image forming members thus obtained, an image was formed on a transfer paper according to the same procedure and under the same conditions as in Example 26, whereby a very clear image quality was obtained.

EXAMPLE 33

By means of the device shown in FIG. 11, image forming members for electrophotography (Sample Nos. 801D to 805D) were prepared, respectively, according to the same procedure as in Example 26 except for changing the respective conditions to those as shown in Table 11D to 15D.

For each of the image forming member thus obtained, an image was formed on a transfer paper according to the same procedure and under the same conditions as in Example 26, whereby a very clear image quality was obtained.

EXAMPLE 34

In Example 26, an electrostatic image was formed by use of a GaAs type semiconductor laser at 810 nm (10 mW) was employed as the light source in place of the tungsten lamp, following otherwise the same toner image forming conditions as in Example 26, to prepare an image forming member for electrophotography. When image quality evaluation was conducted for the image forming member obtained, the image obtained was found to be excellent in resolution and of high quality, which was clear with good gradation reproducibility.

In the following, the common layer forming conditions in the Examples of the present invention are shown:

Substrate temperature:

Layer containing germanium atoms (Ge): about 200° C.

Layer containing no germanium atom (Ge): about 250° C.

Discharging frequency: 13.56 MHz

Inner pressure in the reaction chamber during the reaction: 0.3 torr

TABLE 1A

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $GeH_4/He = 0.05$ | $GeH_4 = 50$ | — | 0.18 | 5 | 3 |
| Second layer | $SiH_4/He = 0.5$ | $SiH_4 = 200$ | — | 0.18 | 15 | 15 |

TABLE 2A

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $SiH_4/He = 0.05$<br>$GeH_4/He = 0.5$ | $GeH_4 = 50$ | $SiH_4/GeH_4 = 0.02$ | 0.18 | 5 | 5 |
| Second layer | $SiH_4/He = 0.5$ | $SiH_4 = 200$ | — | 0.18 | 15 | 5 |

TABLE 3A

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $SiH_4/He = 0.05$<br>$GeH_4/He = 0.5$ | $GeH_4 = 100$ | $SiH_4/GeH_4 = 0.01$ | 0.18 | 10 | 0.5 |
| Second layer | $SiH_4/He = 0.5$<br>$B_2H_6/He = 10^{-3}$ | $SiH_4 = 200$ | $B_2H_6/SiH_4 = 2 \times 10^{-5}$ | 0.18 | 15 | 20 |

TABLE 4A

| Sample No. | 401A | 402A | 403A | 404A | 405A | 406A | 407A |
|---|---|---|---|---|---|---|---|
| Si content (atm. %) | 0 | 0.1 | 0.2 | 0.5 | 1 | 2 | 4 |
| Evaluation | ◎ | ◎ | ◎ | ◎ | ◎ | ○ | Δ |

◎: Excellent
○: Good
Δ: Practically satisfactory

TABLE 5A

| Sample No. | 501A | 502A | 503A | 504A | 505A |
|---|---|---|---|---|---|
| Layer thickness (μ) | 0.05 | 0.1 | 0.5 | 1 | 5 |
| Evaluation | ○ | ○ | ◎ | ◎ | ○ |

◎: Excellent
○: Good

TABLE 6A

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $SiH_4/He = 0.05$<br>$GeH_4/He = 0.5$ | $GeH_4 = 100$ | $SiH_4/GeH_4 = 0.01$ | 0.18 | 10 | 0.5 |
| Second layer | $SiH_4/He = 0.5$<br>$PH_3/He = 10^{-3}$ | $SiH_4 = 200$ | $PH_3/SiH_4 = 1 \times 10^{-7}$ | 0.18 | 15 | 20 |

TABLE 1B

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $SiH_4/He = 0.05$<br>$GeH_4/He = 0.05$<br>$B_2H_6/He = 10^{-3}$ | $SiH_4 + GeH_4 = 50$ | $SiH_4/GeH_4 = 0.01$<br>$B_2H_6/(GeH_4 + SiH_4) = 0.01$ | 0.18 | 5 | 1 |
| Second layer | $SiH_4/He = 0.5$ | $SiH_4 = 200$ | — | 0.18 | 15 | 20 |

TABLE 2B

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $SiH_4/He = 0.05$<br>$GeH_4/He = 0.05$<br>$B_2H_6/He = 10^{-3}$ | $SiH_4 + GeH_4 = 50$ | $SiH_4/GeH_4 = 0.01$<br>$B_2H_6/(SiH_4 + GeH_4) = 0.01$ | 0.18 | 5 | 1 |
| Second layer | $SiH_4/He = 0.05$<br>$GeH_4/He = 0.05$ | $SiH_4 + GeH_4 = 50$ | $SiH_4/GeH_4 = 0.01$ | 0.18 | 5 | 10 |
| Third layer | $SiH_4/He = 0.5$ | $SiH_4 = 200$ | — | 0.18 | 15 | 5 |

TABLE 3B

| Layer constitution | Gases employed | Flow rate (SCCM) | Flow rate ratio | Discharging power ($W/cm^2$) | Layer forming rate (Å/sec) | Layer thickness ($\mu$) |
|---|---|---|---|---|---|---|
| First layer | $SiH_4/He = 0.05$ $GeH_4/He = 0.05$ $B_2H_6/He = 10^{-3}$ | $SiH_4 + GeH_4 = 50$ | $SiH_4/GeH_4 = 0.04$ $B_2H_6/(SiH_4 + GeH_4) = 5 \times 10^{-3}$ | 0.18 | 5 | 2 |
| Second layer | $SiH_4/He = 0.5$ $B_2H_6/He = 10^{-3}$ | $SiH_4 = 200$ | $B_2H_6/SiH_4 = 2 \times 10^{-4}$ | 0.18 | 15 | 20 |

TABLE 4B

| Sample No | 401B | 402B | 403B | 404B | 405B | 406B |
|---|---|---|---|---|---|---|
| $SiH_4/GeH_4$ Flow rate ratio | 0 | $2 \times 10^{-3}$ | 0.01 | 0.02 | 0.03 | 0.05 |
| Si content (atomic %) | 0 | 0.1 | 0.5 | 1 | 2 | 4 |
| Evaluation | ◎ | ◎ | ◎ | ◎ | ◎ | ○ |

◎: Excellent
○: Good

TABLE 5B

| Sample No. | 501B | 502B | 503B | 504B | 505B | 506B | 507B | 508B |
|---|---|---|---|---|---|---|---|---|
| Layer thickness | 30Å | 500Å | 0.1$\mu$ | 0.3$\mu$ | 0.8$\mu$ | 3$\mu$ | 4$\mu$ | 5$\mu$ |
| Evaluation | Δ | ○ | ◎ | ◎ | ◎ | ◎ | ○ | ○ |

◎: Excellent
○: Good
Δ: Practically satisfactory

TABLE 6B

| Layer constitution | Gases employed | Flow rate (SCCM) | Flow rate ratio | Discharging power ($W/cm^2$) | Layer forming rate (Å/sec) | Layer thickness ($\mu$) |
|---|---|---|---|---|---|---|
| First layer | $SiH_4/He = 0.05$ $GeH_4/He = 0.5$ $B_2H_6/He = 10^{-3}$ | $GeH_4 = 50$ | $SiH_4/GeH_4 = 0.02$ $B_2H_6/(GeH_4 + SiH_4) = 5 \times 10^{-3}$ | 0.18 | 5 | 2 |
| Second layer | $SiH_4/He = 0.5$ $PH_3/He = 10^{-3}$ | $SiH_4 = 200$ | $PH_3/SiH_4 = 9 \times 10^{-5}$ | 0.18 | 15 | 20 |

TABLE 7B

| Layer constitution | Gases employed | Flow rate (SCCM) | Flow rate ratio | Discharging power ($W/cm^2$) | Layer forming rate (Å/sec) | Layer thickness ($\mu$) |
|---|---|---|---|---|---|---|
| First layer | $GeH_4/He = 0.05$ $B_2H_6/He = 10^{-3}$ | $GeH_4 = 50$ | $B_2H_6/GeH_4 = 8 \times 10^{-4}$ | 0.18 | 5 | 5 |
| Second layer | $SiH_4/He = 0.5$ $PH_3/He = 10^{-3}$ | $SiH_4 = 200$ | $PH_3/SiH_4 = 1 \times 10^{-5}$ | 0.18 | 15 | 5 |

TABLE 8B

| Layer constitution | Gases employed | Flow rate (SCCM) | Flow rate ratio | Discharging power ($W/cm^2$) | Layer forming rate (Å/sec) | Layer thickness ($\mu$) |
|---|---|---|---|---|---|---|
| First layer | $SiH_4/He = 0.05$ $GeH_4/He = 0.5$ $B_2H_6/He = 10^{-3}$ | $GeH_4 = 50$ | $SiH_4/GeH_4 = 0.005$ $B_2H_6/(GeH_4 + SiH_4) = 9 \times 10^{-4}$ | 0.18 | 5 | 1 |
| Second layer | $SiH_4/He = 0.5$ $B_2H_6/He = 10^{-3}$ | $SiH_4 = 200$ | $B_2H_6/SiH_4 = 9 \times 10^{-4}$ | 0.18 | 15 | 15 |

TABLE 9B

| Layer constitution | Gases employed | Flow rate (SCCM) | Flow rate ratio | Discharging power ($W/cm^2$) | Layer forming rate (Å/sec) | Layer thickness ($\mu$) |
|---|---|---|---|---|---|---|
| First layer | $GeH_4/He = 0.05$ $B_2H_6/He = 10^{-3}$ | $GeH_4 = 50$ | $B_2H_6/(GeH_4 + SiH_4) = 9 \times 10^{-4}$ | 0.18 | 5 | 5 |
| Second layer | $SiH_4/He = 0.5$ $B_2H_6/He = 10^{-3}$ | $SiH_4 = 200$ | $B_2H_6/SiH_4 = 9 \times 10^{-4}$ | 0.18 | 15 | 5 |

TABLE 10B

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $SiH_4/He = 0.005$ $GeH_4/He = 0.5$ $B_2H_6/He = 10^{-3}$ | $GeH_4 = 50$ | $SiH_4/GeH_4 = 1 \times 10^{-3}$ $B_2H_6/(GeH_4 + SiH_4) = 2 \times 10^{-4}$ | 0.18 | 5 | 2 |
| Second layer | $SiH_4/He = 0.5$ $B_2H_6/He = 10^{-3}$ | $SiH_4 = 200$ | $B_2H_6/SiH_4 = 2 \times 10^{-4}$ | 0.18 | 15 | 20 |

TABLE 1C

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $SiH_4/He = 0.005$ $GeH_4/He = 0.5$ NO | $GeH_4 = 50$ | $NO/GeH_4 = 2/100$ $SiH_4/GeH_4 = 1/100$ | 0.18 | 5 | 1 |
| Second layer | $SiH_4/He = 0.5$ | $SiH_4 = 200$ | — | 0.18 | 15 | 15 |

TABLE 2C

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $GeH_4/He = 0.05$ NO | $GeH_4 = 50$ | $NO/GeH_4 = 3/100 \sim 0$ (linearly decrease) | 0.18 | 5 | 3 |
| Second layer | $GeH_4/He = 0.05$ | $GeH_4 = 50$ | — | 0.18 | 5 | 1 |
| Third layer | $SiH_4/He = 0.5$ | $SiH_4 = 200$ | — | 0.18 | 15 | 15 |

TABLE 3C

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $SiH_4/He = 0.005$ $GeH_4/He = 0.5$ NO | $GeH_4 = 50$ | $NO/GeH_4 = 2/100$ $SiH_4/GeH_4 = 1/500$ | 0.18 | 5 | 2 |
| Second layer | $SiH_4/He = 0.5$ NO $B_2H_6/He = 10^{-3}$ | $SiH_4 = 200$ | $NO/SiH_4 = 2/100$ $B_2H_6/SiH_4 = 1 \times 10^{-5}$ | 0.18 | 15 | 2 |
| Third layer | $SiH_4/He = 0.5$ $B_2H_6/He = 10^{-3}$ | $SiH_4 = 200$ | $B_2H_6/SiH_4 = 1 \times 10^{-5}$ | 0.18 | 15 | 15 |

TABLE 4C

| Sample No. | 401C | 402C | 403C | 404C | 405C | 406C | 407C |
|---|---|---|---|---|---|---|---|
| Si content (atm. %) | 0 | 0.1 | 0.2 | 0.5 | 1 | 2 | 4 |
| Evaluation | ◎ | ◎ | ◎ | ◎ | ◎ | ○ | Δ |

◎: Excellent
○: Good
Δ: Practically satisfactory

TABLE 5C

| Sample No. | 501C | 502C | 503C | 504C | 505C |
|---|---|---|---|---|---|
| Layer thickness (μ) | 0.05 | 0.1 | 0.5 | 1 | 5 |
| Evaluation | ○ | ○ | ◎ | ◎ | ○ |

◎: Excellent
○: Good

TABLE 6C

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $SiH_4/He = 0.05$ $GeH_4/He = 0.5$ NO | $GeH_4 = 50$ | $NO/(GeH_4 + SiH_4) = 2/100$ $SiH_4/GeH_4 = 0.02$ | 0.18 | 5 | 0.5 |
| Second layer | $SiH_4/He = 0.5$ $PH_3/He = 10^{-3}$ | $SiH_4 = 200$ | $PH_3/SiH_4 = 1 \times 10^{-7}$ | 0.18 | 15 | 20 |

TABLE 1D

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $SiH_4/He = 0.005$<br>$GeH_4/He = 0.5$<br>$B_2H_6/He = 10^{-3}$<br>NO | $GeH_4 = 50$ | $SiH_4/GeH_4 = 5 \times 10^{-3}$<br>$B_2H_6/GeH_4 = 1 \times 10^{-2}$<br>$NO/GeH_4 = 3/100$ | 0.18 | 5 | 1 |
| Second layer | $SiH_4/He = 0.5$ | $SiH_4 = 200$ | — | 0.18 | 15 | 20 |

TABLE 2D

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $GeH_4/He = 0.5$<br>$B_2H_6/He = 10^{-3}$<br>NO | $GeH_4 = 50$ | $B_2H_6/GeH_4 = 3 \times 10^{-3}$<br>$NO/GeH_4 = 3/100$ | 0.18 | 5 | 1 |
| Second layer | $GeH_4/He = 0.05$ | $GeH_4 = 50$ | — | 0.18 | 5 | 5 |
| Third layer | $SiH_4/He = 0.5$ | $SiH_4 = 200$ | — | 0.18 | 15 | 5 |

TABLE 3D

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $SiH_4/He = 0.05$<br>$GeH_4/He = 0.5$<br>$B_2H_6/He = 10^{-3}$<br>NO | $GeH_4 = 50$ | $SiH_4/GeH_4 = 0.01$<br>$B_2H_6/GeH_4 = 5 \times 10^{-3}$<br>$NO/GeH_4 = 1/100$ | 0.18 | 5 | 2 |
| Second layer | $SiH_4/He = 0.5$<br>$B_2H_6/He = 10^{-3}$ | $SiH_4 = 200$ | $B_2H_6/SiH_4 = 2 \times 10^{-4}$ | 0.18 | 15 | 20 |

TABLE 4D

| Sample No. | 401D | 402D | 403D | 404D | 405D | 406D |
|---|---|---|---|---|---|---|
| $SiH_4/GeH_4$ Flow rate ratio | 0 | $2 \times 10^{-3}$ | 0.01 | 0.02 | 0.03 | 0.05 |
| Si content (atomic %) | 0 | 0.1 | 0.5 | 1 | 2 | 4 |
| Evaluation | ◎ | ◎ | ◎ | ◎ | ◎ | ○ |

◎: Excellent
○: Good

TABLE 5D

| Sample No. | 501D | 502D | 503D | 504D | 505D | 506D | 507D | 508D |
|---|---|---|---|---|---|---|---|---|
| Layer thickness | 30Å | 500Å | 0.1μ | 0.3μ | 0.8μ | 3μ | 4μ | 5μ |
| Evaluation | Δ | ○ | ◎ | ◎ | ◎ | ◎ | ○ | ○ |

◎: Excellent
○: Good
Δ: Pracically satisfactory

TABLE 6D (Sample No. 601D)

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $SiH_4/He = 0.05$<br>$GeH_4/He = 0.5$<br>$B_2H_6/He = 10^{-3}$<br>NO | $GeH_4 = 50$ | $SiH_4/GeH_4 = 0.02$<br>$B_2H_6/(GeH_4 + SiH_4) = 5 \times 10^{-3}$<br>$NO/(GeH_4 + SiH_4) = 1/100$ | 0.18 | 5 | 2 |
| Second layer | $SiH_4/He = 0.5$<br>$PH_3/He = 10^{-3}$ | $SiH_4 = 200$ | $PH_3/SiH_4 = 9 \times 10^{-5}$ | 0.18 | 15 | 20 |

TABLE 7D (Sample No. 602D)

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $GeH_4/He = 0.05$<br>$B_2H_6/He = 10^{-3}$<br>NO | $SiH_4 + GeH_4 = 50$ | $B_2H_6/GeH_4 = 8 \times 10^{-4}$<br>$NO/GeH_4 = 1/100$ | 0.18 | 5 | 5 |

TABLE 7D-continued (Sample No. 602D)

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| Second layer | $SiH_4/He = 0.5$<br>$PH_3/He = 10^{-3}$ | $SiH_4 = 200$ | $PH_3/SiH_4 = 1 \times 10^{-5}$ | 0.18 | 15 | 5 |

TABLE 8D (Sample No. 603D)

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $SiH_4/He = 0.05$<br>$GeH_4/He = 0.5$<br>$B_2H_6/He = 10^{-3}$<br>NO | $GeH_4 = 50$ | $SiH_4/GeH_4 = 0.005$<br>$B_2H_6/GeH_4 = 3 \times 10^{-3}$<br>$NO/GeH_4 = 3/100$ | 0.18 | 5 | 1 |
| Second layer | $SiH_4/He = 0.5$<br>$B_2H_6/He = 10^{-3}$ | $SiH_4 = 200$ | $B_2H_6/SiH_4 = 3 \times 10^{-4}$ | 0.18 | 15 | 20 |

TABLE 9D (Sample No. 701D)

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $SiH_4/He = 0.005$<br>$GeH_4/He = 0.5$<br>$B_2H_6/He = 10^{-3}$<br>NO | $GeH_4 = 50$ | $SiH_4/GeH_4 = 3 \times 10^{-3}$<br>$B_2H_6/GeH_4 = 1 \times 10^{-5}$<br>$NO/GeH_4 = 3/100$ | 0.18 | 5 | 1 |
| Second layer | $SiH_4/He = 0.005$<br>$GeH_4/He = 0.5$<br>$B_2H_6/He = 10^{-3}$ | $GeH_4 = 50$ | $SiH_4/GeH_4 = 3 \times 10^{-3}$<br>$B_2H_6/GeH_4 = 1 \times 10^{-5}$ | 0.18 | 5 | 19 |
| Third layer | $SiH_4/He = 0.5$<br>$B_2H_6/He = 10^{-3}$ | $SiH_4 = 200$ | $B_2H_6/SiH_4 = 3 \times 10^{-4}$ | 0.18 | 15 | 5 |

TABLE 10D (Sample No. 702D)

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $GeH_4/He = 0.05$<br>$B_2H_6/He = 10^{-3}$<br>NO | $GeH_4 = 50$ | $B_2H_6/GeH_4 = 1 \times 10^{-5}$<br>$NO/GeH_4 = 3/100$ | 0.18 | 5 | 1 |
| Second layer | $GeH_4/He = 0.05$<br>NO | $GeH_4 = 50$ | $NO/GeH_4 = 3/100$ | 0.18 | 5 | 1 |
| Third layer | $SiH_4/He = 0.5$<br>NO<br>$B_2H_6/He = 10^{-3}$ | $SiH_4 = 200$ | $NO/SiH_4 = 3/100$<br>$B_2H_6/SiH_4 = 1 \times 10^{-4}$ | 0.18 | 15 | 1 |
| Fourth layer | $SiH_4/He = 0.5$<br>$B_2H_6/He = 10^{-3}$ | $SiH_4 = 200$ | $B_2H_6/SiH_4 = 1 \times 10^{-4}$ | 0.18 | 15 | 15 |

TABLE 11D (Sample No. 801D)

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $SiH_4/He = 0.05$<br>$GeH_4/He = 0.5$<br>$B_2H_6/He = 10^{-3}$<br>NO | $GeH_4 = 50$ | $SiH_4/GeH_4 = 0.01$<br>$B_2H_6/GeH_4 = 3 \times 10^{-3}$<br>$NO/GeH_4 = 3/100 \sim 2.83/100$ | 0.18 | 5 | 1 |
| Second layer | $SiH_4/He = 0.05$<br>$GeH_4/He = 0.5$<br>NO | $GeH_4 = 50$ | $NO/GeH_4 = 2.83/100 \sim 0$<br>$SiH_4/GeH_4 = 0.01$ | 0.18 | 5 | 1 |
| Third | $SiH_4/He = 0.5$ | $SiH_4 = 200$ | | 0.18 | 15 | 19 |

TABLE 11D-continued (Sample No. 801D)

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| layer | | | | | | |

Note:
$NO/GeH_4$ was linearly decreased.

TABLE 12D (Sample No. 802D)

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $SiH_4/He = 0.005$<br>$GeH_4/He = 0.5$<br>$B_2H_6/He = 10^{-3}$<br>NO | $GeH_4 = 50$ | $SiH_4/GeH_4 = 5 \times 10^{-3}$<br>$B_2H_6/GeH_4 = 3 \times 10^{-3}$<br>$NO/GeH_4 = 3/100 \sim 0$ | 0.18 | 5 | 0.5 |
| Second layer | $SiH_4/He = 0.005$<br>$GeH_4/He = 0.5$<br>$B_2H_6/He = 10^{-3}$ | $GeH_4 = 50$ | $SiH_4/GeH_4 = 5 \times 10^{-3}$<br>$B_2H_6/GeH_4 = 3 \times 10^{-3}$ | 0.18 | 5 | 0.5 |
| Third layer | $SiH_4/He = 0.005$<br>$GeH_4/He = 0.5$ | $GeH_4 = 50$ | $SiH_4/GeH_4 = 5 \times 10^{-3}$ | 0.18 | 5 | 19 |
| Fourth layer | $SiH_4/He = 0.5$ | $SiH_4 = 200$ | | 0.18 | 15 | 5 |

TABLE 13D (Sample No. 803D)

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $GeH_4/He = 0.05$<br>$B_2H_6/He = 10^{-3}$<br>NO | $GeH_4 = 50$ | $B_2H_6/GeH_4 = 5 \times 10^{-3}$<br>$NO/GeH_4 = 1/100 \sim 0$ | 0.18 | 5 | 1 |
| Second layer | $GeH_4/He = 0.05$<br>$B_2H_6/He = 10^{-3}$ | $GeH_4 = 50$ | $B_2H_6/GeH_4 = 5 \times 10^{-3}$ | 0.18 | 5 | 1 |
| Third layer | $SiH_4/He = 0.5$<br>$B_2H_6/He = 10^{-3}$ | $SiH_4 = 200$ | $B_2H_6/SiH_4 = 2 \times 10^{-4}$ | 0.18 | 15 | 20 |

TABLE 14D (Sample No. 804D)

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $SiH_4/He = 0.05$<br>$GeH_4/He = 0.5$<br>$B_2H_6/He = 10^{-3}$<br>NO | $GeH_4 = 50$ | $SiH_4/GeH_4 = 0.04$<br>$B_2H_6/GeH_4 = 3 \times 10^{-3}$<br>$NO/GeH_4 = 3/100 \sim 2.83/100$ | 0.18 | 5 | 1 |
| Second layer | $SiH_4/He = 0.5$<br>NO<br>$B_2H_6/He = 10^{-3}$ | $SiH_4 = 200$ | $NO/SiH_4 = 2.83/100 \sim 0$<br><br>$B_2H_6/SiH_4 = 3 \times 10^{-4}$ | 0.18 | 15 | 20 |

Note:
$NO/GeH_4$ and $NO/SiH_4$ were linearly decreased.

TABLE 15D (Sample No. 805D)

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| First layer | $SiH_4/He = 0.001$<br>$GeH_4/He = 0.5$<br>$B_2H_6/He = 10^{-3}$<br>NO | $GeH_4 = 50$ | $SiH_4/GeH_4 = 1 \times 10^{-3}$<br>$B_2H_6/GeH_4 = 1 \times 10^{-5}$<br>$NO/GeH_4 = 3/100 \sim 0$ | 0.18 | 5 | 1 |
| Second layer | $SiH_4/He = 0.001$<br>$GeH_4/He = 0.5$<br>$B_2H_6/He = 10^{-3}$ | $GeH_4 = 50$ | $SiH_4/GeH_4 = 1 \times 10^{-3}$<br>$B_2H_6/GeH_4 = 1 \times 10^{-5}$ | 0.18 | 5 | 10 |
| Third | $SiH_4/He = 0.5$ | $SiH_4 = 200$ | $B_2H_6/SiH_4 = 3 \times 10^{-4}$ | 0.18 | 15 | 7 |

TABLE 15D-continued (Sample No. 805D)

| Layer constitution | Gases employed | Flow rate (SCCM) | Flow rate ratio | Discharging power ($W/cm^2$) | Layer forming rate (Å/sec) | Layer thickness (μ) |
|---|---|---|---|---|---|---|
| layer | $B_2H_6/He = 10^{-3}$ | | | | | |

Note:
$NO/GeH_4$ was linearly decreased.

What is claimed is:

1. A photoconductive member comprising a support for photoconductive member and light receiving layer, said light receiving layer comprising a first layer region comprising an amorphous material containing $Ge_x Si_{1-x}$ ($0.95<x\leq 1$) and atoms of at least one of hydrogen or halogen, and a second layer region exhibiting photoconductivity comprising an amorphous silicon material containing atoms of at least one of hydrogen or halogen; said two layer regions being provided in succession from the support side.

2. A photoconductive member according to claim 1, wherein hydrogen atoms are contained in at least one of the first layer region and the second layer region.

3. A photoconductive member according to claim 1, wherein halogen atoms are contained in at least one of the first layer region and the second layer region.

4. A photoconductive member according to claim 1, wherein the first layer region contains a substance for controlling the conductive characteristics of the first layer region.

5. A photoconductive member according to claim 4, wherein the substance for controlling the conductive characteristics is an atom belonging to the group III of the periodic table.

6. A photoconductive member according to claim 4, wherein the atom belonging to the group V of the periodic table.

7. A photoconductive member according to claim 1, wherein the light receiving layer contains oxygen atoms.

8. A photoconductive member according to claim 1, wherein the first layer region has a layer thickness of 30 Å to 50μ.

9. A photoconductive member according to claim 1, wherein the second layer region was a layer thickness of 0.5 to 90μ.

10. A photoconductive member according to claim 1, wherein the light receiving layer has a layer thickness of 1 to 100μ.

11. A photoconductive member according to claim 1, wherein there is the relation of $T_B/T\leq 1$ between the layer thickness $T_B$ of the first layer region and the layer thickness T of the second layer region.

12. A photoconductive member according to claim 1, wherein the first layer region has a layer thickness of 30μ or less.

13. A photoconductive member according to claim 1, wherein the first layer region contains 0.01 to 40 atomic % of hydrogen atoms.

14. A photoconductive member according to claim 1, wherein the first layer region contains 0.01 to 40 atomic % of halogen atoms.

15. A photoconductive member according to claim 1, wherein the first layer region contains 0.01 to 40 atomic % of hydrogen atoms and halogen atoms as the total amount thereof.

16. A photoconductive member according to claim 1, wherein the second layer region contains 0.01 to 40 atomic % of hydrogen atoms.

17. A photoconductive member according to claim 1, wherein the second layer region contains 0.01 to 40 atomic % of halogen atoms.

18. A photoconductive member according to claim 1, wherein the second layer region contains 0.01 to 40 atomic % of hydrogen atoms and halogen atoms as the total amount thereof.

19. A photoconductive member according to claim 1, wherein there is provided a layer region (PN) containing a p-type impurity throughout the whole first layer region or in a part thereof.

20. A photoconductive member according to claim 19, wherein the content of the p-type impurity in the layer region (PN) is 0.01 to $1\times 10^5$ atomic ppm.

21. A photoconductive member according to claim 1, wherein there is provided a layer region (PN) containing an n-type impurity throughout the whole first layer region or in a part thereof.

22. A photoconductive member according to claim 19, wherein the content of the n-type impurity in the layer region (PN) is 0.01 to $1\times 10^5$ atomic ppm.

23. A photoconductive member according to claim 19, wherein the layer region (PN) is provided so as to occupy at least the first layer region at the end portion on the support side.

24. A photoconductive member according to claim 23, wherein the content of the p-type impurity in the layer region (PN) is 30 atomic ppm or more.

25. A photoconductive member according to claim 21, wherein the layer region (PN) is provided so as to occupy at least the first layer region at the end portion on the support side.

26. A photoconductive member according to claim 25, wherein the content of the n-type impurity in the layer region (PN) is 30 atomic ppm or more.

27. A photoconductive member according to claim 19, wherein there is provided a layer region (Z) containing 0.001 to $1\times 10^4$ atomic ppm of a substance for controlling conduction characteristics in contact with the layer region (PN).

28. A photoconductive member according to claim 27, wherein the substance contained in the layer region (Z) is a p-type impurity.

29. A photoconductive member according to claim 27, wherein the substance contained in the layer region (Z) is a n-type impurity.

30. A photoconductive member according to claim 21, wherein there is provided a layer region (Z) containing 0.001 to $1\times 10^4$ atomic ppm of a substance for controlling conduction characteristics in contact with the layer region (PN).

31. A photoconductive member according to claim 30, wherein the substance contained in the layer region (Z) is a p-type impurity.

32. A photoconductive member according to claim 30, wherein the substance contained in the layer region (Z) is a n-type impurity.

33. A photoconductive member according to claim 1, wherein the light receiving layer comprises a layer region (O) containing oxygen atoms, the content of oxygen atoms in the said layer region (O) being 0.001 to 50 atomic %.

34. A photoconductive member according to claim 33, wherein the ratio of the layer thickness $T_o$ of the layer region (O) occupied in the layer thickness T of the light receiving layer is 2/5 or more.

35. A photoconductive member according to claim 34, wherein the content of oxygen atoms contained in the layer region (O) is 30 atomic % or less.

36. A photoconductive member according to claim 33, wherein the distribution concentration C(O) of the oxygen atoms in the layer region (O) is ununiform in the layer thickness direction.

37. A photoconductive member according to claim 33, wherein the distribution concentration C(O) of the oxygen atoms in the layer region (O) is uniform in the layer thickness direction.

38. A photoconductive member according to claim 36, wherein the maximum value $C_{max}$ of the distribution concentration C(O) is 500 atomic ppm or more.

39. A photoconductive member according to claim 36, wherein the maximum value $C_{max}$ of the distribution concentration C(O) lies in a depth of 5μ or less from the support side.

40. A photoconductive member according to claim 36, wherein the support is composed of any rotatable member.

* * * * *